United States Patent
Sharma et al.

(10) Patent No.: US 8,762,686 B2
(45) Date of Patent: Jun. 24, 2014

(54) MULTIMODE ACCESSIBLE STORAGE FACILITY

(75) Inventors: Nikhil Kumar Sharma, Kanpur (IN); Carlos Antonio Alba Pinto, Eindhoven (NL)

(73) Assignee: Intel Corporation, Santa Clara, CA (US)

( * ) Notice: Subject to any disclaimer, the term of this patent is extended or adjusted under 35 U.S.C. 154(b) by 252 days.

(21) Appl. No.: 13/202,254

(22) PCT Filed: Feb. 22, 2010

(86) PCT No.: PCT/NL2010/050086
§ 371 (c)(1),
(2), (4) Date: Oct. 20, 2011

(87) PCT Pub. No.: WO2010/095944
PCT Pub. Date: Aug. 26, 2010

(65) Prior Publication Data
US 2012/0042149 A1    Feb. 16, 2012

Related U.S. Application Data

(60) Provisional application No. 61/154,168, filed on Feb. 20, 2009.

(51) Int. Cl.
*G06F 9/34* (2006.01)
*G06F 12/02* (2006.01)
*G06F 9/345* (2006.01)
*G06F 9/355* (2006.01)

(52) U.S. Cl.
CPC ............ *G06F 12/0207* (2013.01); *G06F 9/345* (2013.01); *G06F 9/355* (2013.01)
USPC .......................................... 711/219; 711/220

(58) Field of Classification Search
CPC ...... G06F 9/345; G06F 9/355; G06F 12/0207
USPC .................................................. 711/219, 220
See application file for complete search history.

(56) References Cited

U.S. PATENT DOCUMENTS 4,845,640 A * 7/1989 Ballard et al. ................ 345/572
6,031,546 A   2/2000 Shimizu
(Continued)

FOREIGN PATENT DOCUMENTS

GB    2 123 998 A    2/1984
JP    05-020183      1/1993
(Continued)

OTHER PUBLICATIONS

International Search Report for PCT/NL2010/050086 dated Jun. 1, 2010.
(Continued)

*Primary Examiner* — Than Nguyen
(74) *Attorney, Agent, or Firm* — Leydig, Voit & Mayer, Ltd.

(57) ABSTRACT

A multimode accessible storage facility (10) is described that allows block access in a block access mode and row access in a row access mode. The facility comprises—a memory unit (20) comprising a plurality of memory banks (20.0, ..., 20.F) each having a respective bank index (0, ..., F), —an address generator (30) for generating for each of said memory banks a rotated bank address as a function of an input address and a shift parameter, —an input vector data rotator (40) for rotating an input vector and for providing vector elements of the rotated input vector to a respective bank of the memory unit, and—an output vector rotator (50) for inverse rotating a vector comprising vector elements retrieved from respective banks of the memory unit and for providing the rotated output vector.

11 Claims, 11 Drawing Sheets

(56) References Cited

U.S. PATENT DOCUMENTS 6,556,725 B1  4/2003  Kondo et al.
2008/0282038 A1* 11/2008  Sethuraman et al. ......... 711/134

FOREIGN PATENT DOCUMENTS

| | | |
|---|---|---|
| JP | 06-333058 | 12/1994 |
| JP | 2000-090660 A | 3/2000 |
| JP | 2001-22638 A | 1/2001 |
| JP | 2003-84751 A | 3/2003 |
| WO | WO 2005/104027 | 11/2005 |
| WO | WO 2006/120620 A2 | 11/2006 |
| WO | WO 2007/135635 | 11/2007 |
| WO | PCT/NL2010/050086 | 2/2010 |

OTHER PUBLICATIONS

Japanese Patent Office, Notice of Reasons for Rejection in corresponding Japanese Application No. 2011-551027 dated Jul. 9, 2013.
Japanese Patent Office, Notice of Allowance dated Apr. 7, 2014 in corresponding Japanese Application No. 2011-551027.

* cited by examiner $I_B \rightarrow$ $A_B$ ↓

Figure 8A

| | 0 | 1 | 2 | 3 | 4 | 5 | 6 | 7 | 8 | 9 | A | B | C | D | E | F |
|---|---|---|---|---|---|---|---|---|---|---|---|---|---|---|---|---|
| 0 | 0 | 1 | 2 | 3 | 4 | 5 | .. | .. | | | | | | | 0E | 0F |
| 1 | .. | 1F | 10 | 11 | 12 | 13 | | | | | | | | | | 1D |
| 2 | .. | .. | 2E | 2F | 20 | 21 | 22 | .. | | | | | | | | 2B |
| 3 | | | .. | .. | 3F | 30 | 31 | 32 | .. | | | | | | | |
| 4 | | | | | | .. | 4F | 40 | 41 | 42 | | | | | | .. |
| 5 | | | | | | | | | .. | 5F | 50 | 51 | 52 | | | |
| 6 | 64 | 65 | .. | | | | | | | | | .. | 6F | 60 | 61 | 62 |
| 7 | 72 | .. | | | | | | | | | | | | .. | 7F | 70 |

Figure 8B

| | 0 | 1 | 2 | 3 | 4 | 5 | 6 | 7 | 8 | 9 | A | B | C | D | E | F |
|---|---|---|---|---|---|---|---|---|---|---|---|---|---|---|---|---|
| 0 | 0 | 1 | 2 | 3 | 4 | 5 | .. | .. | | | | | | | 0E | 0F |
| 1 | .. | .. | 1E | 1F | 10 | 11 | 12 | 13 | | | | | | | | 2B |
| 2 | | | | | | | .. | 2F | 20 | 21 | 22 | 23 | | | | .. |
| 3 | 64 | 65 | .. | | | | | | | .. | 3F | 30 | 31 | 32 | 33 | |

MULTIMODE ACCESSIBLE STORAGE FACILITY

BACKGROUND

1. Field of the Invention

The present invention relates to a multimode accessible storage facility.

The present invention further relates to method for storing a row of data elements.

The present invention further relates to a method for retrieving a block of data elements.

2. Related Art

Many image processing algorithms require that arbitrary blocks of image data are rapidly available. Accordingly for these algorithms a storage facility having a blockwise access is mandatory. On the other hand input data for these algorithms is usually provided linearly in a raster scan fashion. Likewise it may be necessary to provide the processed data again in raster scan fashion. It is further noted that user requirements with respect to processing speed, and raster size are rapidly growing to enable real-time realistic scene rendering.

WO2006/120620 describes an image processing circuit with a block accessible buffer memory. The buffer memory comprises a plurality of rows of memory circuits for storing pixel values from a window. The memory circuits are arranged as shift circuits, each for a respective row and arranged to shift assignment of pixel values from the respective row to the groups.

There is a need to provide for a storage facility that efficiently supports both access in a raster scan fashion as well as access in a blockwise fashion in a standard multi-bank memory.

SUMMARY

According to a first aspect of the invention a multimode accessible storage facility is provided that allows block access in a block access mode and row access in a row access mode, the facility comprising a memory unit comprising a plurality of memory banks each having a respective bank index, an address generator for generating for each of said memory banks a rotated bank address as a function of an input address and a shift parameter, an input data rotator for rotating an input row and for providing data elements of the rotated input row to a respective bank of the memory unit, an output rotator for inverse rotating a row comprising data elements retrieved from respective banks of the memory unit and for providing the rotated output row.

According to a second aspect of the invention a method for storing a row of data elements is provided, comprising the steps of receiving the row, receiving an input address indicative for a storage location of the row, rotating the data elements in the row by an amount dependent on the storage location of the row, assigning a bank address for each element as a function of the input address, storing the row in a multibank memory, wherein respective data elements are stored at a respective bank address of a respective bank.

According to a third aspect of the invention a method is provided for retrieving a block of data elements from a multi-bank memory, the method comprising the steps of receiving an input address indicative for a storage location of the block of data elements, calculating a bank address for a plurality of memory banks as a function of the input address, retrieving a row with respective data elements from said memory from the bank addresses calculated for said memory banks, rotating the data elements in the row by an amount dependent on the storage location of the block and providing the row with the rotated data elements as the block.

In the row access mode the received row is rotated by an amount dependent on the storage location of the row, i.e. the address in the bank. Accordingly rows stored at subsequent addresses are stored with mutually different rotations. A rotation is understood to be a cyclic shift. Accordingly a rotation by NR indicates that data that would otherwise be assigned to a memory bank with index IB is instead assigned to a memory bank IB+NR mod NB, where NB is the number of memory banks. Accordingly data in different rows of a block is assigned to different memory banks. This makes it possible to retrieve said data simultaneously in the block access mode. In the block access mode the address generator generates for each of the memory banks a rotated bank address as a function of an input address and a shift parameter to retrieve the proper lines of the block.

BRIEF DESCRIPTION OF THE DRAWINGS

These and other aspects are described in more detail with reference to the drawing. Therein:

FIG. 8A shows a first example of an arrangement of a block of data elements, FIG. 8B shows a second example of an arrangement of a block of data elements.

DETAILED DESCRIPTION OF EMBODIMENTS

In the following detailed description numerous specific details are set forth in order to provide a thorough understanding of the present invention. However, it will be understood by one skilled in the art that the present invention may be practiced without these specific details. In other instances, well known methods, procedures, and components have not been described in detail so as not to obscure aspects of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. It will be understood that when an element is referred to as being "connected to" or "coupled to" another element, it can be directly connected or coupled to the other element or intervening elements may be present. In contrast, when an element is referred to as being "directly connected to" or "directly coupled to" another element, there are no intervening elements present. Like numbers refer to like elements throughout. As used herein, the term "and/or" includes any and all combinations of one or more of the associated listed items.

It will be understood that, although the terms first, second, third etc. may be used herein to describe various elements, components, and/or sections, these elements, components, and/or sections should not be limited by these terms. These terms are only used to distinguish one element, component or section from another element, component, and/or section. Thus, a first element, component, and/or section discussed below could be termed a second element, component, and/or section without departing from the teachings of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. All publications, patent applications, patents, and other references mentioned herein are incorporated by reference in their entirety. In case of conflict, the present specification, including definitions, will control. In addition, the materials, methods, and examples are illustrative only and not intended to be limiting.

Figure 1:
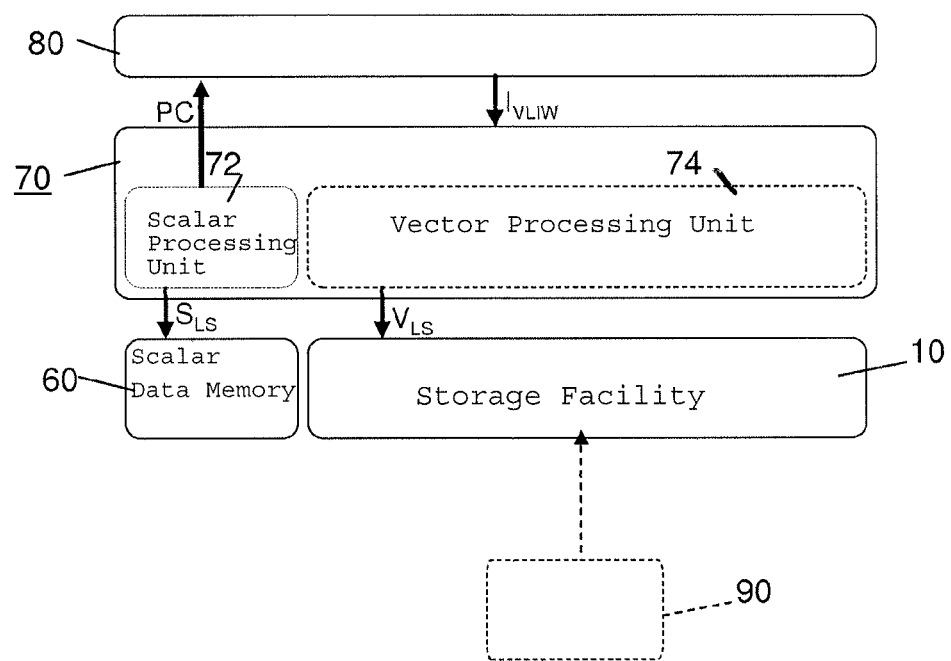
FIG. 1 schematically shows a dataprocessing apparatus.

FIG. 1 schematically shows a dataprocessing apparatus. The apparatus comprises a VLIW processor 70 having a vector processing unit 74 that exchanges vector data Vload/Store with a storage facility 10. The VLIW processor 70 generates a program counter PC and retrieves VLIW instructions $I_{VLIW}$ from an address in a program memory indicated by the program counter. In this case the VLIW processor 70 includes a scalar processing unit 72 that exchanges data $S_{LS}$ with a scalar data memory 60. In this embodiment the scalar processor 72 is responsible for generating the program counter PC. The data processing apparatus is in particular suitable for processing 2D data, like image data of various nature.

Figure 2:
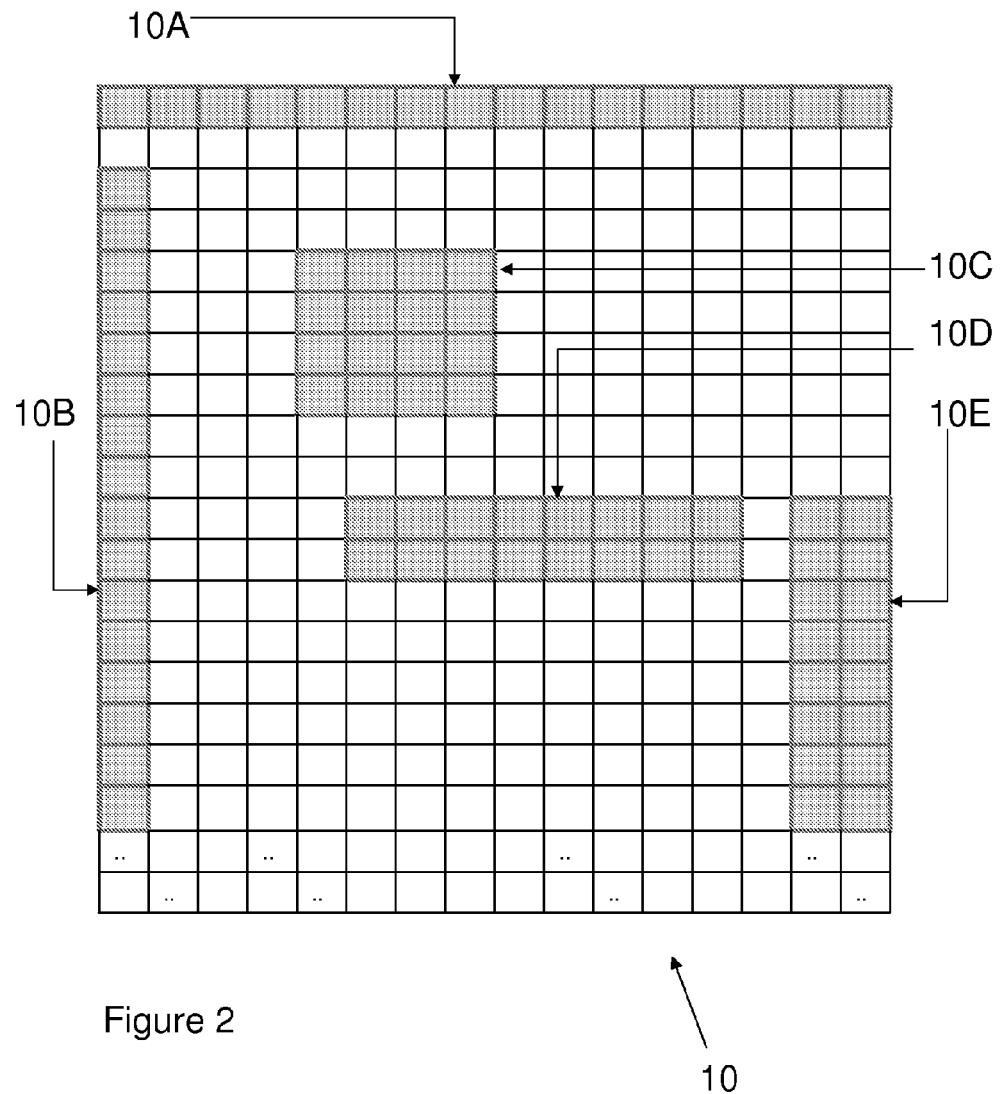
FIG. 2 shows a plurality of access modes.

FIG. 2 shows a plurality of access modes for a storage facility. According to a row access mode 10A the storage facility is accessed row-wise. In that access mode a row of elements is simultaneously accessed, i.e. written to or read from the memory. This is a common way of data access when the storage facility exchanges data with other facilities, e.g. when data is obtained from a scanner or camera, or when data is provided to a frame buffer. However, for image processing tasks, also other access modes are required, for example column access mode 10B, or a block access mode. Depending on the type of image processing algorithm access may be required for example to 4×4 blocks according to access mode 10C, 8×2 blocks according to access mode 10D, or to 2×8 blocks according to access mode 10E. A column (10B) may be considered as a 1×16 block.

Figure 3:
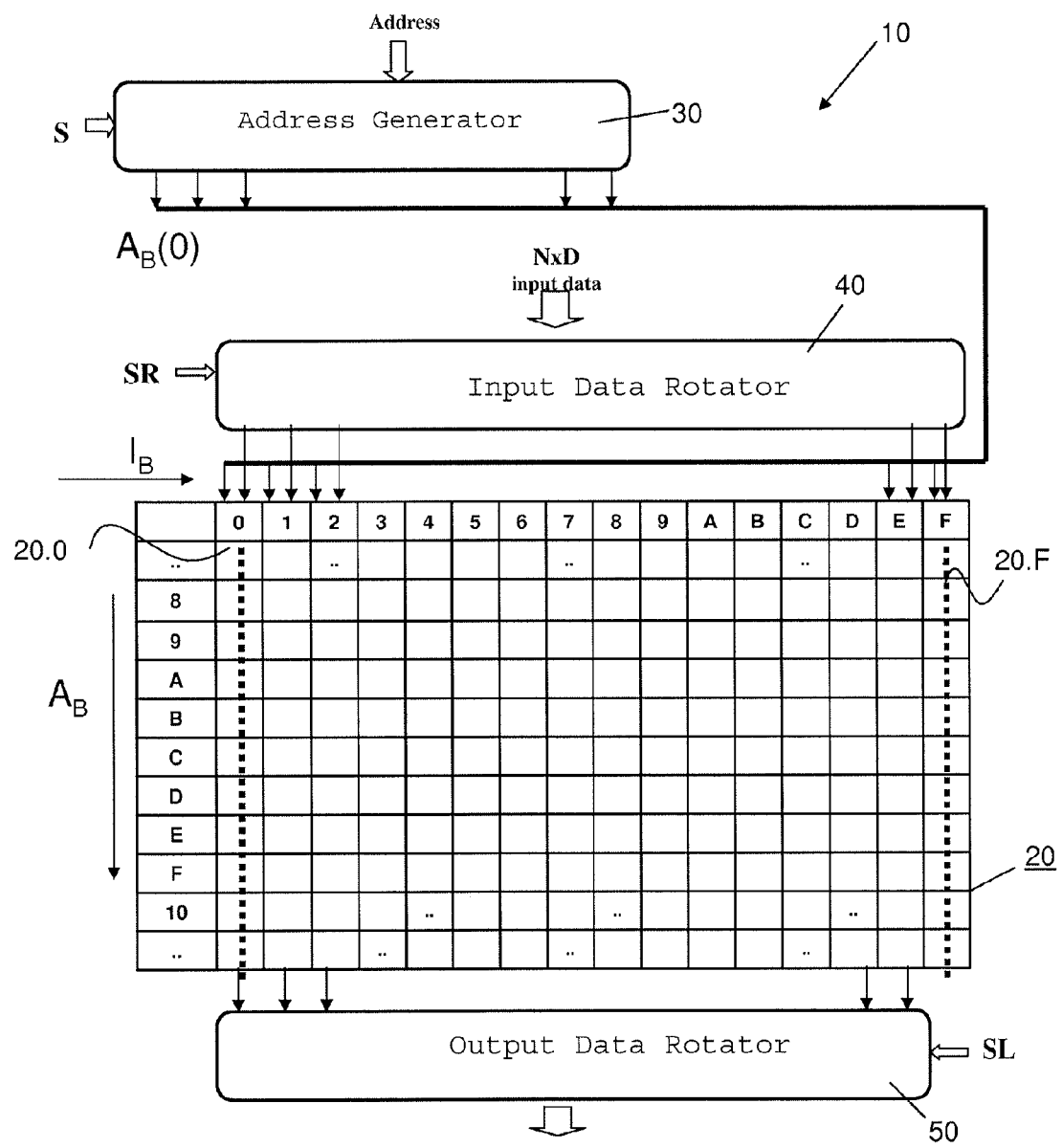
FIG. 3 shows an embodiment of a storage facility according to the invention.

FIG. 3 shows an embodiment of a storage facility 10 according to the invention in more detail. The storage facility 10 is a multimode accessible storage facility in that it allows both row access mode and block access mode. The storage facility 10 comprises a memory unit 20 with a plurality of memory banks 20.0, . . . , 20.F each having a respective bank index 0, . . . , F. For clarity only the first and the last bank are indicated with a reference. By way of example it is presumed that the memory unit comprises 16 banks. It will be understood however that any number NB of banks is possible The storage facility 10 further comprises an address generator 30 for generating for each of said memory banks 20.0, . . . , 20.F a rotated bank address as a function of an input address and a shift parameter S.

The storage facility 10 further comprises an input data rotator 40 for rotating an input row by an amount SR and for providing the rotated input row to the memory unit 20.

The storage facility 10 also comprises an output rotator 50 for inversely rotating a row retrieved from the memory unit 20 by an amount SL and for providing the rotated output row.

The address generator 30 generates for each of said memory banks 20.0, . . . 20.F a rotated bank address BA(0), . . . , BA(F) as a function of an input address Address and a shift parameter SR.

Figure 4:
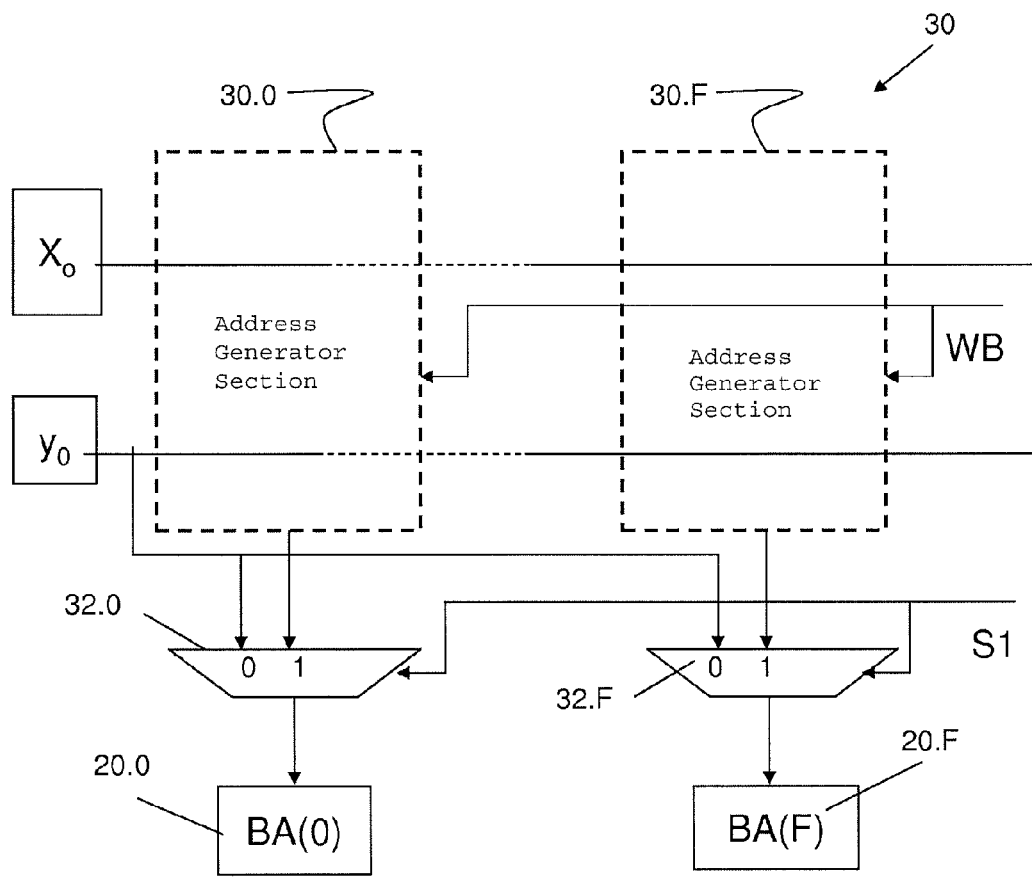
FIG. 4 shows a part of the embodiment of FIG. 3 in more detail.

FIG. 4 schematically shows an embodiment of the address generator 30 in more detail. In said embodiment the address generator 30 comprises sections 30.0 to 30.F to generate a rotated bank address for respective banks 20.0 to 20.F dependent on a selected blockwidth BW and multiplexing elements 32.0 to 32.F controlled by a signal S1, that either select the rotated bank address provided by a respective section 30.0 to 30.F or the original address $y_0$. For clarity only the first and the last section and their corresponding multiplexing element are shown. The address generator is controllable by input parameters WB and mode selection indicator S1. In this embodiment S1=0 indicates row access mode, and S1=1 indicates block access mode.

Figure 5:
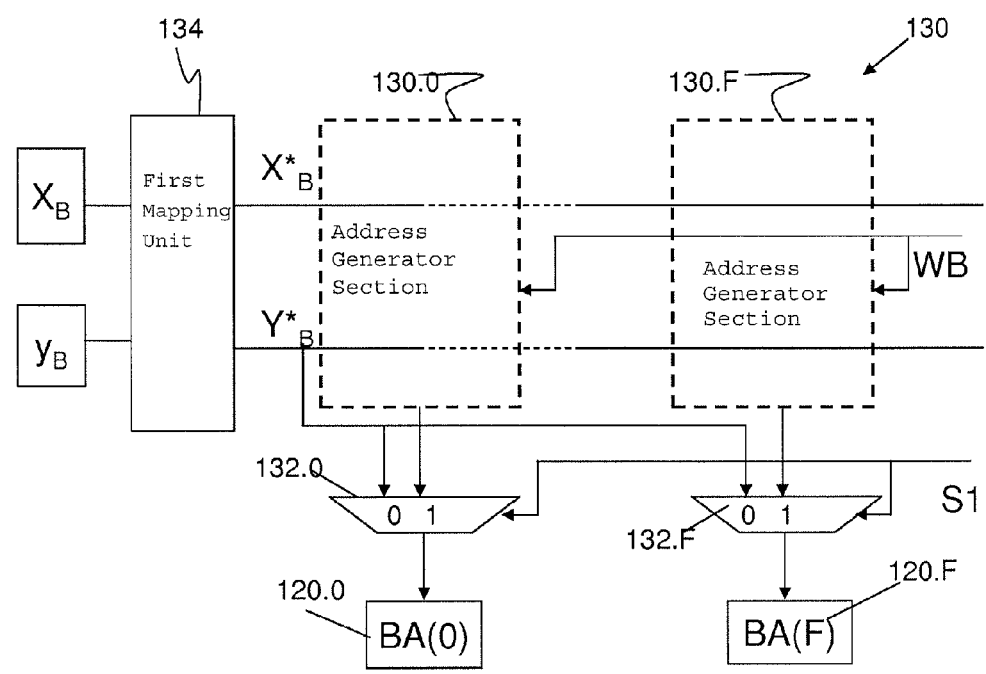
FIG. 5 shows said part in an alternative embodiment of the storage facility.
Figure 6A:
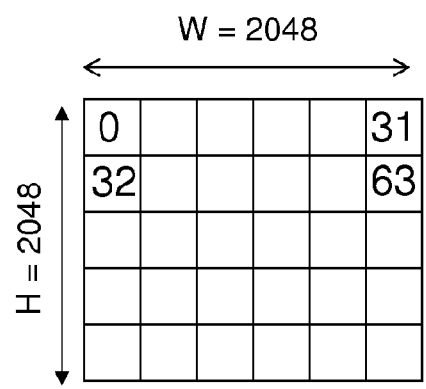
FIG. 6A, 6B illustrates a mapping of data elements.
Figure 6B:
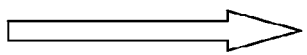
Figure 6B:
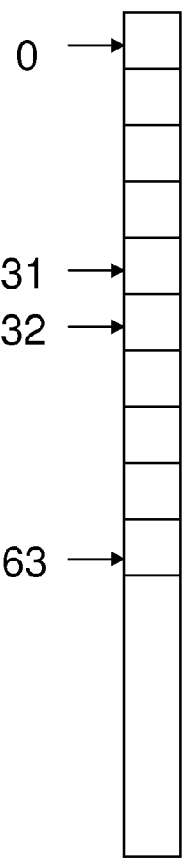

In FIG. 5, parts corresponding to those in FIG. 4 have a reference number that is 100 higher. FIG. 5 shows an address generator 130 in another embodiment of the storage facility according to the invention that comprises a first mapping unit 134 for mapping coordinates from a first coordinate system having coordinates X,Y into a second coordinate system having coordinates X*,Y*. The X coordinate in the first coordinate system is defined by bits $X_{nx1-1}, \ldots, X_0$ and the Y coordinate in the first coordinate system is defined by bits $Y_{ny1-1}, \ldots, Y_0$ and wherein the X* coordinate in the second coordinate system is defined by bits $X^*_{nx2-1}, \ldots, X^*_0$ and the Y* coordinate in the second coordinate system is defined by bits $Y^*_{ny2-1}, \ldots, Y^*_0$. Index 0 indicates the least significant bit, and nx1−nx2=ny2−ny1=n. The mapping unit 134 generates an output address having an X* and an Y* coordinate according to $X^*=X_{nx1-n-1}, \ldots, X_0$,
$Y^*=Y_{ny1-1}, \ldots, Y_m, X_{nx1-1}, \ldots, X_{nx1-n}, Y_{m-1}, \ldots, Y_0$ An example of this address mapping is illustrated with reference to FIG. 6A, 6B. FIG. 6A schematically illustrates an image having a width W and a height H of 2048 pixels. Accordingly in this embodiment nx1=11, ny1=11. The image is partitioned into primary cells having a width of 64 pixels and a height of 8 pixels. The primary cells are ordered from left to right and from top to bottom. Four of these primary cells are indicated by their number 0, 31, 32, 63. After the address mapping by mapping unit 134, the image data is arranged as schematically indicated in FIG. 6B. This second coordinate system X*,Y* is related to the input coordinate system X,Y as follows:
X*=X$_5$, . . . , X$_0$
Y*=Y$_{10}$, . . . , Y$_3$, X$_{10}$, . . . , X$_6$, Y$_2$, . . . , Y$_0$
Hence nx2=6, ny2=16; n=5; m=3.

Figure 7:
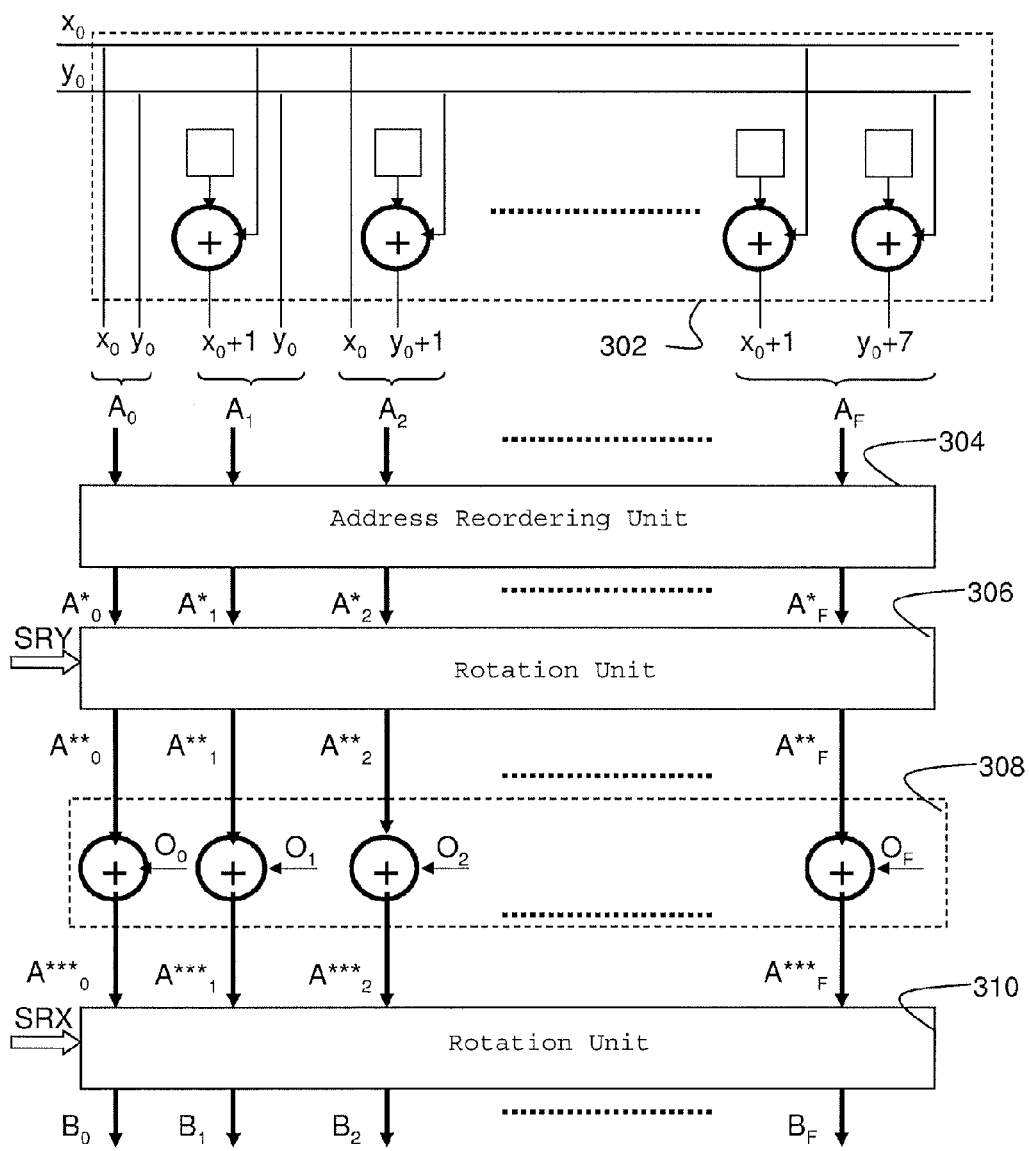
FIG. 7 shows an exemplary implementation of an address generator suitable for the embodiment.

FIG. 7 shows an exemplary implementation of the address generator 30. In FIG. 7, starting from a coordinate (x$_0$,y$_0$) of a single element of the block to be addressed, the address A$_0$, . . . , A$_F$ of each element (x$_0$+1, y$_0$), . . . (x$_F$+1, y$_F$) of the block is calculated in block coordinate generator 302. The number of elements of the block corresponds to the number of banks of the storage facility. A block element may comprise a plurality of pixels. For example 4 pixels of 8 bit may be stored in a single memory bank element of 32 bits. In that case the least significant bits of the x-coordinate may be used to identify a particular pixel within a memory bank element.

The generated addresses A may be considered to be composed of groups of bits as follows
A=<SN><CLN><CN><CW>, therein
SN and CLN respectively indicate the most and the least significant bits of the y-coordinate. CN and CW indicate the most and the least significant bits of the x-coordinate.

An image may be considered as composed as a number of primary cells, wherein the most significant bits of the x and the y coordinate identify the primary cell of a coordinate and the least significant bits of the x and y coordinate indicate the relative position of the coordinate within that primary cell.

Subsequently each of the generated addresses A, is reordered by address reordering unit 304 to a reordered address A*, defined by
A*=<SN><CN><CLN><CW>
Subsequently the set of reordered addresses A*$_0$, . . . , A*$_F$ is rotated with SRY, by rotation unit 306 such that:

$$A**_I = A_{I-SRY \bmod NB}$$

Therein SRY=(WB)·y0. and NB is the number of banks.
WB is the block width in banks
If the block width equals an integer number of banks, the calculation of SR is strongly simplified. For example if the block width WB is 2, the value of SRY is simply 2*y0, which equals to y0<<2.

The rotation of the set of addresses with SRY can be carried out efficiently by a rotator 306 known as such, e.g. by a barrel shifter.

Only the nly least significant bits of y0 are necessary for the calculation in view of the fact that the rotation is effected modulo NB. Therein $$nly = {}^2\log(NB) - {}^2\log(WB)$$

Hence, in case that NB=16, WB=2, the value of nly=3.
It is noted that the address reordering unit 304 and the rotation unit 306 may be reversed in order.

Subsequently offset addition module 308 calculates and adds an offset O$_I$ to each of the addresses A**$_I$ according to:

$$A*_I = A_I + O_I$$

The offsets O$_I$ are calculated according to $$O_I = \left\lfloor \frac{I}{WB} \right\rfloor$$

Accordingly, in the example that the blockwidth WB is 2 banks, then the calculation reduces to $$O_I = \lfloor I >> 1 \rfloor$$

and the following sequence of offsets is obtained:

$$O_I = 0,0,1,1,\ldots 7,7$$

The bank addresses B1 are calculated from addresses A***$_I$ by a second rotation unit 310 by rotation with an amount SRX.

Accordingly the address B$_I$ for bank I is:

$$B_I = A***_{I-SRX \bmod NB}$$

SRX is derived from the x0 coordinate of the block within the primary cell. In view of the fact that the rotation operation is a modulo NB operation, only the least significant bits nx of the x-position are relevant, wherein nx=$^2$log NB. In case that there are ND>1 pixels per bank element, the x0-coordinate of the block is derived from the x0-pixel coordinate x'$_0$ by:

$$x_0 = \lfloor x'_0 >> np \rfloor, \text{ wherein } nlx \text{ is } {}^2\log ND$$

Various access modes of the storage facility 10 according to the present invention are described now.

When writing a row in row access mode of the storage facility according to the invention the input data rotator 40 rotates an input row by an amount SR and provides the rotated input row to the memory unit 20. Therein SR=WB·y, y being the y coordinate of the row.

According to this rotation data elements with coordinates x,y are mapped to bankindex I$_B$ as follows $$I_B = (WB \cdot y + x >> np) \bmod NB,$$

The elements of the row are mapped in each bank at bank address A$_B$=y. Therein WB is a block width. During block-access mode the data can be retrieved from the storage facility in blocks having this width. NB is the number of banks, and 2$^{np}$ is the number of data elements per bank address.

FIG. 8A schematically shows an example, wherein the block width WB is equal to two banks and the number of banks NB is 16. It is further presumed that every bank-address comprises 4 data elements. In this example, the first row of data elements 0-0F, having bank address 0 is stored without rotation, the second row, having bank address 1 is rotated by 2, the third row, having bank address 2 is rotated by 4.

In this embodiment the block to be read out can be aligned at steps of 4 pixels.

In this embodiment each next row is rotated by an amount corresponding to the block width WB. Hence a row stored at bank address A$_B$ is rotated by WB*A$_B$ mod NB.
As each memory bank has a width of 4 pixels this implies that each subsequent row is rotated by 2 banks, which is equivalent to 8 pixels. However, other block sizes may be selected. FIG. 8B for example shows how in the same storage facility data may be stored suitable for retrieval in the form of blocks having a width of 16 pixels and a height of 4 pixels. In this case each subsequent row is rotated by 4 banks. As is set out with reference to FIG. 9 for example, the storage facility may have different planes. A first plane may for example store data for access as 16*4 blocks and another plane may for example store date as 8*8 blocks.

It is not necessary that the rows are rotated by an amount that is a monotonous function of the row number. It is sufficient that separate rows of a block are stored in separate banks. For example a pseudo random function may be used by the input rotator, provided that the inverse function is known by the output rotator.

During row read access mode, an inverse rotation by an amount of SL banks is applied by the output rotator 50 when reading a row y. Therein SL=-WB·y.

During block write access mode, the address generator 30 generates for each of the memory banks 20.0, . . . , 20.F a rotated bank address as a function of an input address and a shift parameter as follows.

$$A_B(I_B) = y_0 + \left\lfloor \left(\frac{I_B}{WB} - x_0 \gg np\right)\right\rfloor \mathrm{mod} NROW$$

Therein NROW is the maximum allowable number of rows of a block, $I_B$ is the bank index, $x_0$, $y_0$ indicates the reference coordinates of the block to be retrieved, e.g. the upper left corner. The horizontal position of the block corresponds to the bank index $I_B$ of the upper left data element of the block.

The maximum allowable number of rows NR of a block is the number of banks NB divided by the width WB of a block.

By way of example a first block is shown in light gray in FIG. 8A. This block has a horizontal position $x_0=0$. Accordingly, the generated bank addresses $B_A(I_B)$ are ($y_0$, $y_0$, $y_0+1$, $y_0+1$, . . . $y_0+7$, $y_0+7$). For the block having horizontal position x0=8, which is equivalent to bank index 2, the generated bank addresses $B_A(I_B)$ are ($y_0+7$, $y_0+7$, $y_0$, $y_0$, . . . $y_0+6$, $y_0+6$).

A data processing apparatus as shown in FIG. 1 optionally has a data providing unit 90 (indicated in dashed lines) that provides image data of an image having a width greater than a total datawidth defined by the plurality of memory banks of the storage facility 10. Accordingly an alternative address generator 130 is provided as described with reference to FIG. 5. The image providing unit 90 may be a camera or another memory.

Figure 9:
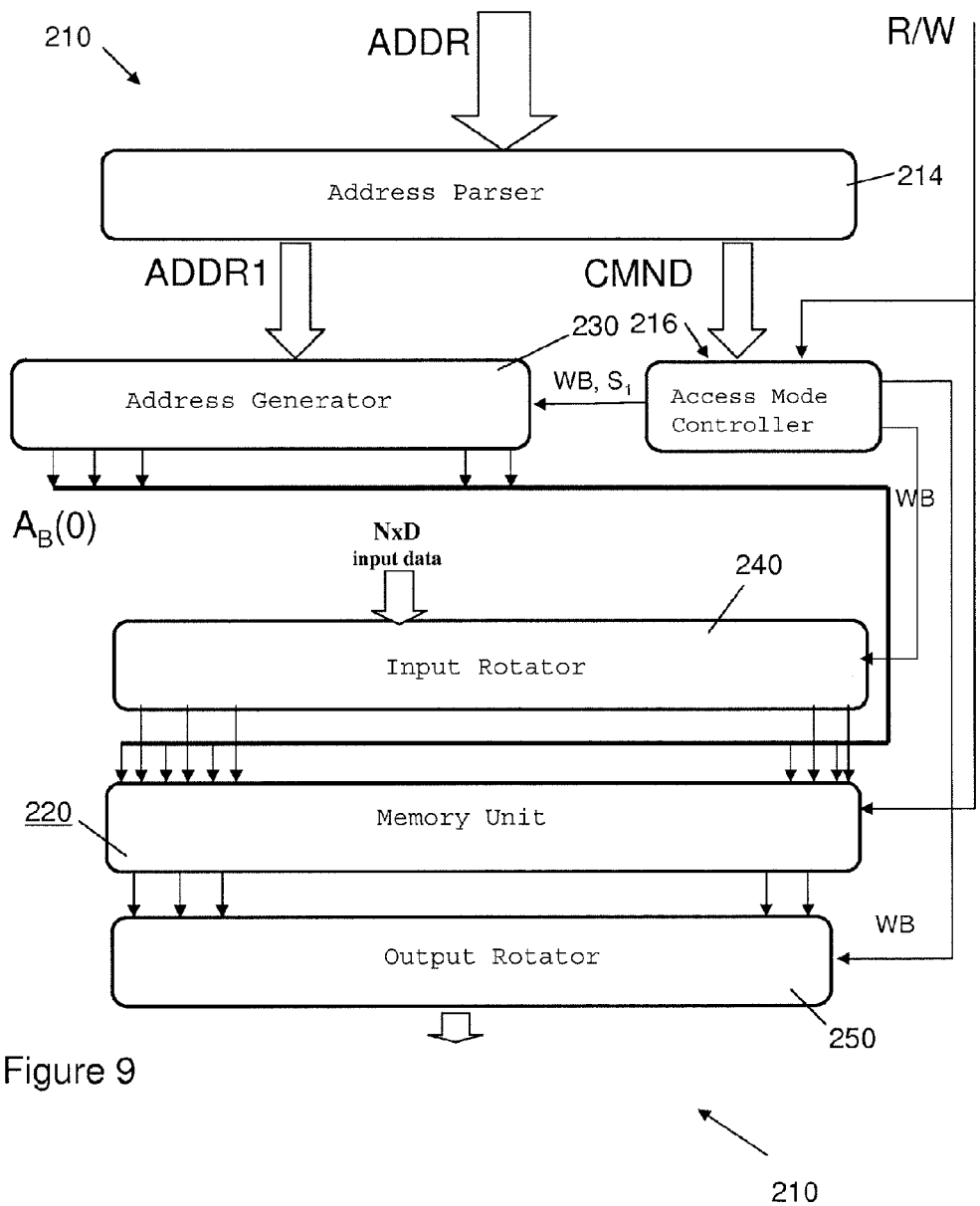
FIG. 9 illustrates a further embodiment of a storage facility according to the invention.

FIG. 9 shows a further embodiment of a multimode accessible storage facility 210 according to the invention. Parts therein corresponding to those in FIG. 3 have a reference number that is 100 higher. In the embodiment shown in FIG. 9 the storage facility 210 comprises an address parser 214 that separates the address ADDR provided at the address port into a first set of address lines for identifying an address ADDR1 within the storage facility 210 and a second set of address lines for providing commands CMND to an access mode controller 216.

In an embodiment the most significant part of the address ADDR forms the command CMND. By way of example the command is composed of the following fields.

<Mode (2)>|<R/B(2)>|<Plane ID (4)>=>8 bits, aligned to nibbles

These fields have the following meaning:

| Type | Value | Description |
| --- | --- | --- |
| Mode (2 bits) - [27:26] Decides the mode of operation | 00 | Vector Single Addressing |
| | 01 | 2D Addressing |
| | 10 | reserved |
| | 11 | Plane Addressing |
| R/B (2 bit) - [25:24] Valid only for 2D mode | 00 | Row operation on a 2D plane |
| | 01 | Block operation on a 2D plane |
| Plane ID (4 bits) - [23:20] The value decides which plane is being accessed | 00, 01. . . | |

The first command bits determine the access mode.

In the first access mode (vector single addressing) the storage facility 210 is accessible as a conventional memory. Accordingly, the address generator 230 performs no address rotation and the input rotator 240 and the output rotator 250 are inactive. In the 2D accessing mode the storage facility 210 allows both row access R/B=00 as well as block access R/B=01.

In the storage facility 210 according to this embodiment the storage space can be subdivided in various parts (here denoted as planes) that have unique properties. In order to define the settings for these planes, the storage facility 210 has a further addressing mode, denoted as the plane accessing mode (mode=11). The plane to be accessed is indicated by the plane ID field. In this case 16 different planes can be defined, but in other embodiments a higher or lower number of planes may be allowed.

Figure 10:
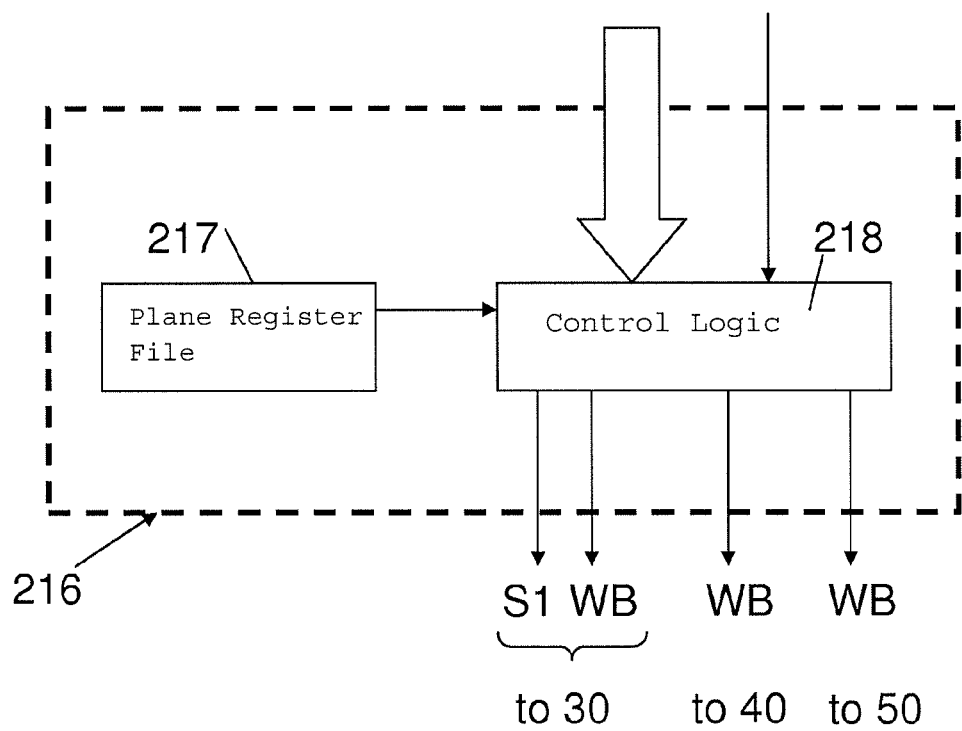
FIG. 10 shows a part of said embodiment in more detail.

As shown in FIG. 10, the access mode controller 216 comprises control logic 218 and plane register file 217.

The settings for each plane may be defined by a respective register in the plane register file 217. These registers may have the following fields.

| Type | Parameter | Data Vector Element | Description |
| --- | --- | --- | --- |
| Block dimension in power of two | log2(WB) | 0[3:0] | Block width WB × HB = NB |
| | log2(HB) | 1[3:0] | Block height WB × HB = NB |
| Base Address of Plane byte address for start of plane, should be a new vector address | Base Address Byte 0 | 2[7:0] | Plane address [7:0] |
| | Base Address Byte 1 | 3[7:0] | Plane address [15:8] |
| | Base Address Byte 2 | 4[7:0] | Plane address [23:16] |
| Plane dimension in power of two | log2(Px) | 5[3:0] | Plane width This corresponds to the Image width, aligned to the nearest power of two in size. It is double for an interleaved plane |
| | log2(Py) | 6[3:0] | Plane height This should be a power of two and greater or equal to Block height, HB For min segment width of SIMD, the max segment height can be capacity of memory |

-continued

| Type | Parameter | Data Vector Element | Description |
|---|---|---|---|
| Plane type | 0: Normal<br>1: Interleaved | 7[0] | Normal/Interleaved plane select<br>Two planes are assumed to be interleaved with Vector/Row interleaving. |

Figure 11A:
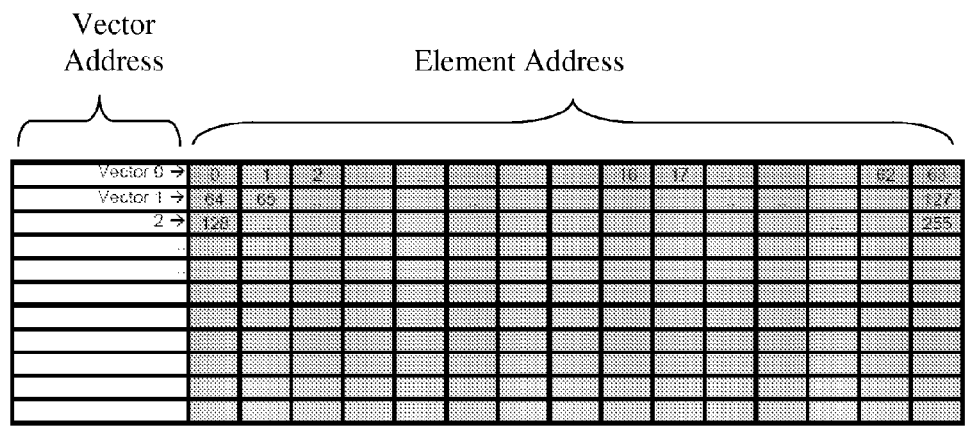
FIG. 11A, 11B shows two operational modes of an embodiment of the storage facility, FIG. 12 schematically shows contents of a plane in an embodiment of the storage facility.
Figure 11B:
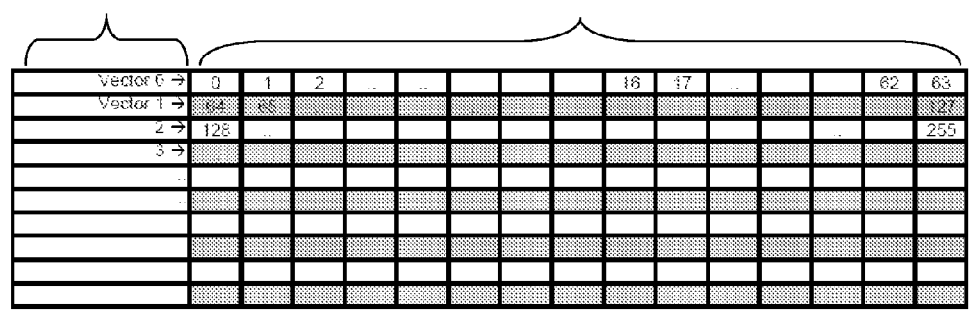

FIG. 11A shows an example of normal plane access. FIG. 11B shows an example of interleaved plane access. The latter access mode is suitable if each vector element has a LUMA and CHROMA component. In that case the data can be represented in an interleaved fashion with plane width as double (2048×2=4096). In this interleaved fashion each odd line comprises the LUMA components and the subsequent even lines (indicated in gray) comprises the corresponding CHROMA components. This interleaving might be required for streaming interfaces which don't generate separate base addresses for each of LUMA/CHROMA component vectors. Blocks for each component type can be retrieved separately by addressing either the odd or the even lines.

Figure 12:
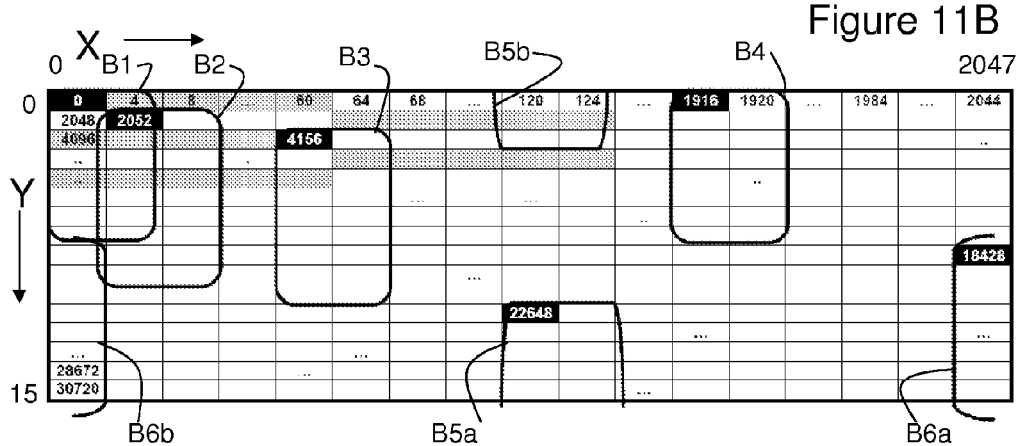

FIG. 12 schematically shows contents of a plane of the storage facility that in the first coordinate system has a width of 2048 pixels and a height of 16 pixels. Pixels are indicated by their address A, wherein A=X+2048*Y. In the embodiment shown the storage facility comprises a memory with 16 banks. Each memory element comprises 4 vector elements of 16 bits. Not all bits need to be used. In an embodiment for example 9 bits per vector element are used. The plane has a storage capacity of 1024 vectors with a length of 64 pixels. In the top left corner some vectors are illustrated by white and gray. I.e. a first vector occupies the addresses 0 to 63. A second vector occupies address 64 to 127, etc. FIG. 12 further schematically shows the addressability of blocks of pixels within this storage facility. A first block B1 having start address A=0 is aligned with the vector boundaries. However arbitrary blocks having an offset X=4*m, Y=n with respect to the origin A=0, where m, n are integer numbers>=0 may be addressed as shown by blocks B2, B3, B4. A modular address calculation is applied i.e. the block B5 having start address 22648 comprises a first part B5a that extends up to Y=15. The next line of the block B5 is 15+1 mod 16=0, so that the block has a second part B5b at the top of the plane. Likewise block B6 with start address 18428 has a first part B6a that extends from X=2044 to X=2047 and a second part that extends at the left side of the plane from X=0 to X=3.

According to the present invention, the image lines are stored in a rotated fashion in the image memory. Each subsequent image line of the primary cell is rotated (shifted cyclically) by a number of banks corresponding to the width Bx of the blocks to be fetched. Due to the fact that each subsequent line is stored in a different set of memory banks, they can be retrieved simultaneously from the memory.

In the claims the word "comprising" does not exclude other elements or steps, and the indefinite article "a" or "an" does not exclude a plurality. A single component or other unit may fulfil the functions of several items recited in the claims. The mere fact that certain measures are recited in mutually different claims does not indicate that a combination of these measures cannot be used to advantage. Any reference signs in the claims should not be construed as limiting the scope. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Various functions of the storage facility may be implemented either in dedicated hardware or by a suitable programmed processor or by a combination of both.

The invention claimed is:

1. A multimode accessible storage facility that allows block access in a block access mode and row access in a row access mode, the storage facility comprising:
   a memory unit comprising a plurality of memory banks, each memory bank having a respective bank index,
   an address generator for generating, for each of said memory banks, a rotated bank address as a function of an input address and a shift parameter,
   an input vector data rotator for rotating an input vector and for providing vector elements of the rotated input vector to a respective bank of the memory unit,
   an output vector rotator to inversely rotate a vector comprising vector elements retrieved from respective banks of the memory unit and for providing the rotated output vector,
   an address port with a first set of address lines to identify an address within the storage facility and a second set of address lines to provide commands to the access mode controller, wherein the second set of address lines comprises at least one from the set of lines consisting of: operation mode indication lines and access mode indication lines,
   wherein the storage facility has a plurality of planes, the second set of address lines comprising plane identification lines.

2. A data processing apparatus, comprising the multimode accessible storage facility of claim 1, and a vector processing unit coupled to the multimode accessible storage facility.

3. The data processing apparatus according to claim 2, further comprising a data providing unit that provides image data of an image having a width greater than a total data width defined by the plurality of memory banks, and wherein the address generator organizes the image data from the data providing unit as primary cells, each primary cell having a width corresponding to said total data width.

4. The data processing apparatus according to claim 3, wherein the primary cells have a height that is less than a height of an image provided by the image data providing unit.

5. The multimode accessible storage facility according to claim 1, wherein the address generator comprises a mapping unit for mapping coordinates from a first coordinate system having coordinates X,Y into a second coordinate system having coordinates X*,Y*, wherein the X coordinate in the first coordinate system is defined by bits Xnx1-1, . . . , X0 and the Y coordinate in the first coordinate system is defined by bits Yny1-1, . . . , Y0 and wherein the X* coordinate in the second coordinate system is defined by bits X*nx2-1, . . . , X*0 and the Y* coordinate in the second coordinate system is defined by bits Y*ny2-1, ..., Y*0, wherein index 0 indicates the least significant bit, wherein nx1−nx2=ny2−ny1=n, and the mapping unit generates an output address having an X* and an Y* coordinate according to:

X*=Xnx1−n−1, ..., X0,
Y*=Yny1-1, ..., Ym, Xnx1-1, ..., Xnx1-n, Ym-1, ..., Y0.

6. The multimode accessible storage facility according to claim 1, further comprising an access-mode controller.

7. The multimode accessible storage facility according to claim 6, wherein the access-mode controller includes at least one register that comprises a value indicative for a block size applicable for blockwise data access.

8. A method for storing a row of data elements in a multimode accessible storage facility having a plurality of planes and comprising a memory unit with a plurality of memory banks, the method comprising the steps of:
   receiving the row of data elements,
   receiving an input address indicative for a storage location of the row, the address further including a command indicating that the mode is a write mode, that the data to be stored is arranged as a row of data elements and further indicating a plane of the storage facility wherein the row of data elements is to be written,
   rotating the data elements in the row by an amount dependent on the storage location of the vector,
   assigning a bank address for each data element as a function of the input address, and
   storing respective data elements of the row at a respective bank address of a respective bank of the memory unit in the indicated plane of the multimode accessible storage facility.

9. The method according to claim 8, wherein the step of assigning a bank address comprises:
   receiving an input address comprising first data indicative for an x location, and second data indicative for a y location in an image,
   partitioning the first data into a most significant part and a least significant part, and
   assigning the bank address on the basis of said most significant part of the first data and on the second data.

10. A method for retrieving a block of data elements from a multimode accessible storage plurality of planes and comprising a memory unit with a plurality of memory banks, the method comprising the steps of;
   receiving an input address indicative for a storage location of the block of data elements, the address further including a command indicating that the mode is a read mode, that the data to be read is arranged as a block of data elements and further indicating a plane of the multibank memory wherein the block of data elements is to be stored,
   calculating a bank address for a plurality of memory banks as a function of the input address,
   retrieving a row with respective data elements from the bank addresses calculated for said memory banks of the memory unit in the indicated plane of the multimode accessible storage facility, and
   rotating the data elements in the row by an amount dependent on the storage location of the row and providing the row with the rotated data elements as the block.

11. A method for storing two-dimensional data into a multimode accessible storage facility having a plurality of planes and comprising a memory unit with a plurality of memory banks, the two-dimensional data comprising values as a function of at least a first and a second mutually independent coordinate, the method comprising:
   receiving a value for a first coordinate and a second coordinate,
   receiving a command indicating that the mode is a write mode, that the data to be written is arranged as a block of data elements and further indicating a plane of the multimode accessible storage facility wherein the block of data elements is to be stored,
   assigning a bank number of a memory bank of the memory unit in the indicated plane of the multimode accessible storage facility, and assigning an address within said memory bank, to store the value,
   wherein the bank number $I_B$ is a function of both the first and the second coordinate, according to $I_B$=WB·y+ x>>np) mod NB, wherein WB is a block width of a block stored in the multimode accessible storage facility from which, during block-access mode the data can be retrieved, wherein NB is the number of banks, and wherein $2^{np}$ is the number of data elements per bank address.

* * * * *